United States Patent [19]

Kirsch

[11] 4,366,400
[45] Dec. 28, 1982

[54] DELAY GATE CIRCUIT

[75] Inventor: Howard C. Kirsch, Emmaus, Pa.

[73] Assignee: Bell Telephone Laboratories, Incorporated, Murray Hill, N.J.

[21] Appl. No.: 96,897

[22] Filed: Nov. 23, 1979

Related U.S. Application Data

[62] Division of Ser. No. 929,369, Jul. 31, 1978, Pat. No. 4,250,414.

[51] Int. Cl.$^3$ .................... H03K 17/284; H03K 3/353
[52] U.S. Cl. ...................................... 307/594; 307/584
[58] Field of Search .............. 307/448, 450, 453, 554, 307/562, 568, 575, 577, 578, 584, 594, 603, 605, 270

[56] References Cited

U.S. PATENT DOCUMENTS

| | | | |
|---|---|---|---|
| 3,551,692 | 12/1970 | Yen | 307/453 X |
| 3,628,065 | 12/1971 | Hill | 307/605 X |
| 3,659,286 | 4/1972 | Perkins et al. | 307/448 X |
| 4,000,413 | 12/1976 | Wong et al. | 307/270 X |
| 4,061,933 | 12/1977 | Schroeder et al. | 307/270 X |
| 4,275,313 | 6/1981 | Boll et al. | 307/270 X |

OTHER PUBLICATIONS

Christopherson, "Fet Hysteresis Circuit", IBM Tech. Discl. Bull., vol. 15, No. 5, pp. 1475–1476, 10/1972.
Hsu, "True, Push-Pull Driver", IBM Tech. Discl. Bull., vol. 19, No. 3, pp. 998–999, 8/1976.

*Primary Examiner*—Larry N. Anagnos
*Attorney, Agent, or Firm*—Irwin Ostroff

[57] ABSTRACT

A delay gate circuit consists of first and second stages which each have two serially connected MOS transistors and of a fifth MOS transistor. The gates of the transistors of the first stage serve as first and second circuit input terminals. The gate of the second transistor of the first stage is connected to the gate of the first transistor of the second stage. An output terminal of the first stage is connected to the gate of the second transistor of the second stage and to the drain of the fifth MOS transistor. An output terminal of the second stage is connected to the gate of the fifth transistor and serves as the output circuit terminal.

2 Claims, 3 Drawing Figures

DELAY GATE CIRCUIT

This application is a division of application Ser. No. 929,369, filed July 31, 1978 now U.S. Pat. No. 4,250,414.

TECHNICAL FIELD

This invention relates to voltage generator circuitry and, more particularly, to dynamic MOS voltage circuitry capable of generating voltage pulses which have a high level which is greater in potential than an available power supply.

BACKGROUND OF THE INVENTION

Many of today's dynamic random access MOS memories require potential levels which are more positive or more negative in potential than those of the power supplies used with the memories. One frequently used circuit which provides such a potential consists of two serially connected MOS transistors with a capacitor connected between the common terminal of both and the gate terminal of the first. The source of a third MOS transistor is connected to an output terminal and to the gate of the first transistor. The drain of the third transistor is connected to an input terminal and to an input of a delay gate whose output is connected to the gate of the second transistor. One problem with this circuitry is that the capacitor is completely discharged during a cycle of operation and must be fully recharged within the delay time of the delay gate at the beginning of each cycle. In addition, any load capacitance connected to the output terminal must also be charged through the third transistor and then by the capacitor of the circuit. This requires the third transistor and the circuit capacitor both be relatively large.

SUMMARY OF THE INVENTION

A solution to the above-discussed problems is achieved in an illustrative embodiment of the present invention. The embodiment is voltage generator circuitry which includes first, second and third circuit terminals (12, 16, 18); a first switching device (Q2) having a first output terminal coupled to the first circuit terminal (12) and having a second output terminal coupled to the second terminal (16); a first capacitor means (Q5) having a first terminal coupled to the second circuit terminal (16) and having a second terminal coupled to the third circuit terminal (18); a delay gate (28) having a first input terminal coupled to the first circuit terminal (12) and having an output terminal (20) coupled to the third circuit terminal (18); and is characterized by:

fourth and fifth circuit terminals (14, 26); a second switching device (Q4) having a control terminal coupled to the second circuit terminal (16), and having a first output terminal coupled to the fourth circuit terminal (14); and having a second terminal coupled to the fifth circuit terminal (26); voltage setting means (Q3, Q15, Q16, Q17) coupled to the fourth circuit terminal (14); and a second capacitor means (Q1) having first and second terminals coupled to the first and fourth circuit terminals (12, 14), respectively.

The second capacitive circuit means (Q1) is never completely discharged during any portion of an operating cycle of the voltage generator circuitry and thus terminal 14 can be relatively rapidly charged to the desired potential level above that of an available power supply (VDD) at the beginning of a cycle of operation.

Another embodiment of the present invention is a delay gate (28) which includes first, second, third, and fourth switching devices (Q10, Q11, Q12, and Q13), each having a control terminal and first and second output terminals, the second output terminal of the first switching device (Q10) being coupled to the first output terminal of the second switching device (Q11) and to the control terminal of the fourth switching device (Q13) and to a first circuit terminal (30), the control terminals of the second and third switching devices (Q11 and Q12) being coupled together to a second circuit terminal (22), the second output terminal of the third switching device (Q12) being coupled to the first output terminal of the fourth switching device (Q13) and to a third circuit terminal (20) and is characterized by a fifth switching device (Q14) having a control terminal coupled to the third circuit terminal (20) and a first output terminal coupled to the first circuit terminal (30). The fifth switching device (Q14) introduces additional delay time but essentially does not affect the rise time of the voltage waveforms appearing at third circuit terminal (20).

These and other features of the invention are better understood from a consideration of the following detailed description taken in conjunction with the accompanying drawings.

DETAILED DESCRIPTION

Figure 1:
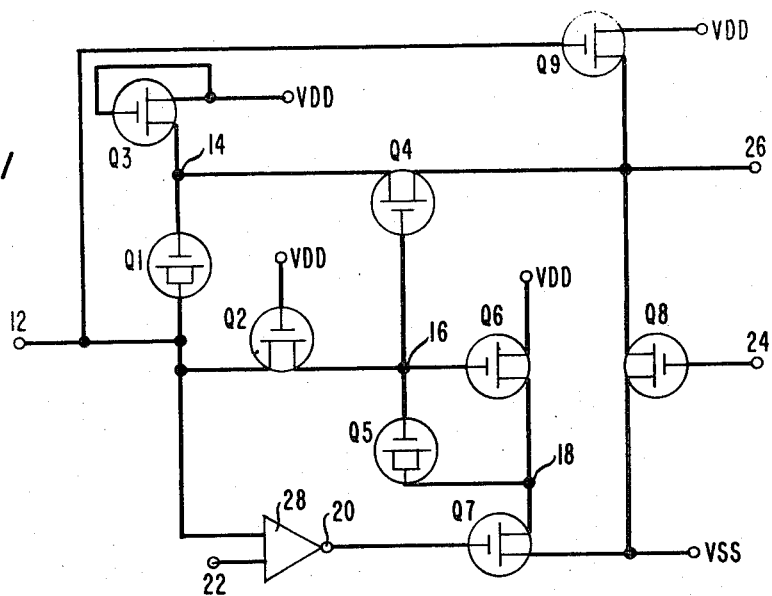
FIG. 1 illustrates voltage generator circuitry in accordance with an illustrative embodiment of the invention.

Referring now to FIG. 1, there is illustrated voltage generator circuitry 10 which is typically used to selectively generate a voltage level at a circuit output terminal 26 which is greater (more positive or more negative) than that of an available power supply voltage VDD. As will become clear, an input "0" level signal applied to a circuit input terminal 12 results in a "0" output signal at circuit output terminal 26 and, conversely, an input "1" level signal which is no more positive in potential than VDD results in a "1" output signal level which is more positive in potential than that of VDD.

Figure 2:
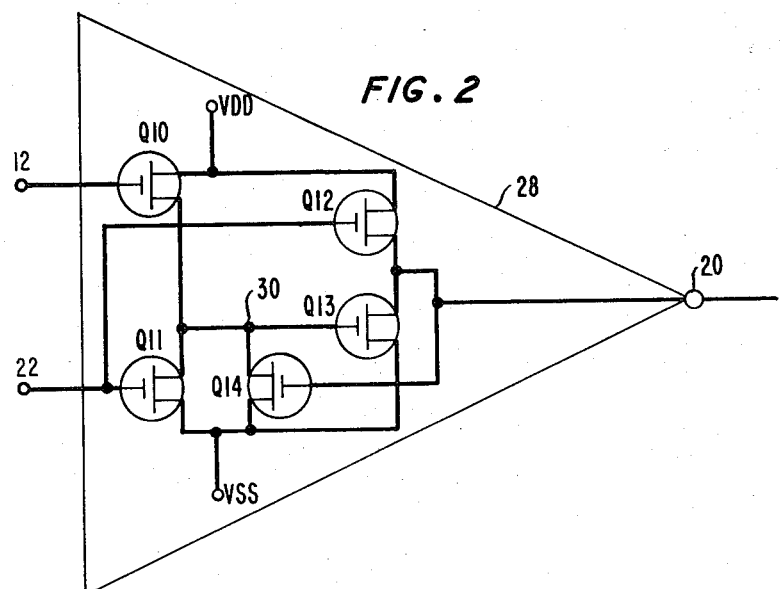
FIG. 2 illustrates an embodiment of a portion of the circuitry of FIG. 1.

Voltage generator circuitry 10 comprises MOS transistors Q1, Q2, Q3, Q4, Q5, Q6, Q7, Q8, and Q9 and a delay gate circuit 28. For illustrative purposes these transistors are assumed to be n-channel type MOS transistors. P-channel MOS transistors can be utilized provided the voltages are appropriately changed. If p-channel transistors are used then the output "1" level is more negative than the level of the power supply used. Delay gate circuit 28 performs an inverter function with delay. It has a precharge terminal 22 which causes an output terminal 20 thereof to be set to a preselected value and another input terminal coupled to circuit input terminal 12. An illustrative embodiment of delay gate 28 is illustrated in FIG. 2 as comprising MOS transistors Q10, Q11, Q12, Q13 and Q14. Q14 is optional and may be eliminated. For illustrative purposes these transistors are also assumed to be n-channel MOS transistors.

Q1 and Q5 are connected to perform a capacitor function. The drain and source of each are connected together and serve as one terminal. The gate serves as the other terminal. If Q1 or Q5 is enabled (biased on), it acts as a capacitor which couples voltage changes appearing at the drain and source to the gate. If Q1 or Q5 is disabled (biased off), there is little capacitive coupling from drain and source to gate.

Circuit input terminal 12 is coupled to the gate of Q9, the source and drain of Q1, the drain of Q2, and an input of delay gate circuit 28. Circuit output terminal 26 is coupled to the source of Q9, the drain of Q8, and the source of Q4. The drain of Q4, the gate of Q1, and the source of Q3 are all coupled together to terminal 14. The gates of Q4, Q5, and Q6, and the source of Q2 are all coupled together to terminal 16. The source of Q6 and the drain of Q7 are coupled together to terminal 18 and to the drain and source of Q5. An output terminal 20 of delay gate circuit 28 is coupled to the gate of Q7. The sources of Q7 and Q8 are both coupled to power supply VSS. The gate and drain of Q3 and the drain of Q9 are coupled to power supply VDD.

In FIG. 2 the gate of Q10 is coupled to circuit input terminal 12. The gates of Q11 and Q12 are both coupled to a terminal 22. The source of Q10, the drain of Q11, the gate of Q13, and the drain of Q14 are all coupled to a terminal 30. The source of Q12, the drain of Q13, and the gate of Q14 are coupled to output terminal 20 of delay gate 28. The sources of Q11, Q13 and Q14 are coupled to power supply VSS. The drains of Q10 and Q12 are both coupled to power supply VDD.

At the end of a cycle operation of voltage generator circuitry 10, a "0" signal is applied to terminal 12 and a "1" signal is applied to terminals 22 and 24. For illustrative purposes the following potential levels are assumed; VSS=0 volts, VDD=12 volts, a "0" is approximately 0 volts and a "1" is approximately +10 volts or more positive. Q2 is enabled and terminal 16 thus assumes a "0" level. These potentials disable Q4, Q5, and Q6 and enable Q8. Q9 is also disabled since the gate thereof (terminal 12) is at a "0" level. Output terminal 26 thus is set to the potential of VSS (a "0") since Q8 is enabled and Q4 and Q9 are disabled. Output terminal 20 of gate delay circuit 28 is at a "1" level with terminal 12 at a "0" level and terminal 22 at a "1" level. The actual internal workings of delay gate circuit 28 will be explained later. This causes Q7 to be enabled. Terminal 18 assumes the level of VSS since Q7 is enabled and Q6 is disabled. Terminal 14 is charged via enabled Q3 to a level of VDD minus the threshold level (Vth) of Q3. The threshold voltages (Vths) of all illustrated transistors are assumed to be essentially the same.

At the beginning a cycle of operation terminal 12 is pulsed to a "1" level and terminals 22 and 24 are pulsed to a "0" level. These signal levels enable Q9 and disable Q8. This causes output terminal 26 to be charged to VDD−Vth of Q9. Terminal 16 assumes a "1" level minus the threshold voltage of Q2. Q1 capacitively couples the positive change in potential appearing at terminal 12 to terminal 14 and thus increases the potential thereof from VDD−Vth to VDD plus several volts. Q4 is disabled at this time since the source (terminal 26) of Q4 is at essentially the same potential level as the gate (terminal 16) and the drain (terminal 14) is at a more positive potential than the gate (terminal 16).

The "1" level of terminal 12 causes delay gate circuit 28 to switch output terminal 20 thereof to a "0" level after a delay associated with delay gate circuit 28. Q6 becomes enabled prior to the time Q7 is disabled. The ratio of transconductances of Q6 and Q7 is selected such that the voltage appearing at terminal 18, with Q6 and Q7 both enabled, is close to that of VSS. As Q7 is disabled, terminal 18 positively increases in potential towards VDD. Q5 is already enabled and, accordingly, the positive increase in potential appearing at terminal 18 is capacitively coupled via Q5 to terminal 16. This increases the potential of terminal 16 to a level of VDD plus several volts. Q4 now becomes enabled and the potential at terminal 14 is transmitted via enabled Q4 to output terminal 26. The delay associated with delay gate circuit 28 is selected to allow terminal 16 to reach the potential level of VDD−Vth of Q2 prior to the time the potential of terminal 18 begins to rise towards VDD.

The potential of circuit input terminal 12 can now be returned to a "0" level and the potentials of terminals 22 and 24 can now be returned to a "1" level. Another cycle of voltage generator circuitry 10 can be started.

The internal operation of delay gate circuit 28 is as follows: With a "0" applied to terminal 12 and a "1" applied to terminal 22, Q10 is disabled and Q11 and Q12 are enabled. This causes terminal 30 to assume a "0" level (VSS) which disables Q13. Output terminal 20 of delay gate circuit 28 assumes the potential of the drain of enabled Q12, VDD−Vth of Q12. Q14, which is optional, is enabled at this time, but since the drain and source are both at approximately VSS there is no conduction therethrough. Terminal 12 is now pulsed to a "1" level and terminal 22 is pulsed to a "0" level. This enables Q10 and disables Q11 and Q12. Q14 is still enabled at this time. Without Q14, terminal 30 would rapidly move in potential to VDD−Vth of Q10 and thus enable Q13. This causes output terminal 20 of delay gate circuit 28 to assume a "0" level (VSS). Q14 causes delay gate circuit 28 to have a greater delay time in responding to the change in input signal levels than is the case without it. In addition, Q14 has essentially no effect on the rise time of the voltage waveform at terminal 20.

Q14 is already enabled as Q10 becomes enabled. Q14 acts to hold terminal 30 at VSS (a "0" level) until it is overcome by the charging of terminal 30 via enabled Q10. The transconductances of Q10 and Q14 are selected such that when Q10 and Q14 are both enabled, the potential of terminal 30 moves towards VDD−Vth of Q10, but does so more slowly than would be the case without Q14 present. Q14 acts to delay the charging of terminal 30 until Q13 becomes enabled. Once terminal 30 reaches a threshold voltage above VSS, Q13 becomes enabled and the potential of terminal 20 rapidly decreases to VSS. This disables Q14 and allows terminal 30 to rapidly charge to VDD−Vth of Q10.

A capacitor could be used at terminal 30 instead of Q14. One disadvantage of the use of a capacitor is that it slows the rise time of voltages appearing at terminal 30 even after the potential of terminal 30 is a threshold voltage above VSS. This slows the rise time of voltages appearing at terminal 20.

Initially Q14 inhibits terminal 30 from moving up in potential; however, once it has moved up sufficiently to enable Q13, then Q13 rapidly switches output terminal 20 to VSS and, accordingly, disables Q14. Thus, the use of Q14 introduces additional delay time but essentially does not affect the rise time of the voltage waveforms appearing at terminal 20.

Figure 3:
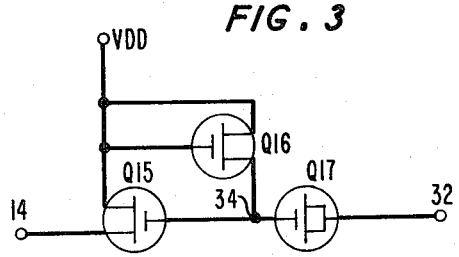
FIG. 3 illustrates an embodiment of another portion of the circuitry of FIG. 1.

Referring now to FIG. 3, there is illustrated precharge circuitry coupled to terminal 14 which comprises MOS transistors Q15, Q16, and Q17. Q17 has the source and the drain thereof coupled together to terminal 32 and the gate coupled to the gate of Q15, the source of Q16 and to terminal 34. The gate and drain of Q16 and the drain of Q15 are all coupled to power supply VDD. These three transistors can be substituted for Q3 of FIG. 1 in order to charge terminal 14 to a level of VDD instead of to just within one threshold voltage of VDD.

Terminal 34 nominally is at a potential level of VDD−Vth of Q16. Terminal 14 is thus at a potential level of VDD−2Vth (the Vth of Q15 plus the Vth of Q16). Terminal 32 is then positively pulsed in potential. This causes terminal 34 to reach a potential level of VDD plus several volts. This allows terminal 14 to reach the potential level of VDD. It is thus easier and faster for the circuitry of FIG. 1 (with the circuitry of FIG. 3 substituted for Q3 of FIG. 1) to thereafter further increase the potential of terminal 14 to VDD plus several voltages via the capacitive effect of Q1 when terminal 12 is pulsed from a "0" to a "1".

The gate of Q2 can be coupled to circuitry similar to that of FIG. 3 instead of being coupled to VDD. This facilitates terminal 16 being initially charged to the full level of VDD instead of VDD−Vth of Q2. It is thus easier and faster to then increase the potential of terminal 16 to VDD plus several volts.

The basic voltage generator circuitry of FIG. 1, using the precharge circuitry of FIG. 3 instead of Q3, and with the gate of Q2 coupled to similar type precharge circuitry instead of being coupled to VDD, has been fabricated as part of a 16K Random Access Memory and found to be functional.

The embodiments described herein are intended to be illustrative of the general principles of the present invention. Various modifications are possible consistent with the spirit of the invention. For example, capacitors other than MOS transistors can be utilized. Still further, a variety of delay gate circuits other than those disclosed could be used. Still further, transistor Q2 can be replaced with a diode or other rectifying means.

I claim:

1. Circuitry comprising: first, second, third, and fourth switching devices (Q10, Q11, Q12, and Q13, respectively) each having a control terminal and first and second output terminals;
   the second output terminal of the first switching device (Q10) being coupled to the first output terminal of the second switching device (Q11), to the control terminal of the fourth switching device (Q13), and to a first circuitry terminal (30);
   the control terminals of the second and third switching devices (Q11 and Q12) being coupled together to a second circuitry terminal (22);
   the second output terminal of the third switching device (Q12) being coupled to the first output terminal of the fourth switching device (Q13) and to a third circuitry terminal 20;
   the control terminal of the first switching device (Q10) serving as a first input terminal;
   the second circuitry terminal (22) serving as a second input terminal;
   the third circuitry terminal (20) serving as a circuitry output terminal; and
   the first output terminals of the first and third switching devices (Q10 and Q12) being coupled together and being connectable to a first biasing source (VDD);
   the second output terminals of the second and fourth (Q11 and Q13) switching devices being coupled together and being connectable to a second biasing source (VSS); and
   a fifth switching device (Q14) having a control terminal coupled to the third circuitry terminal (20), said fifth switching device having a first output terminal coupled to the first circuitry terminal (30) and having a second output terminal coupled to the second output terminal of the second switching device (Q11).

2. The circuitry of claim 1 wherein the fifth switching device (Q14) is an MOS transistor.

* * * * *